US008546281B2

(12) United States Patent
Lee et al.

(10) Patent No.: US 8,546,281 B2
(45) Date of Patent: Oct. 1, 2013

(54) GLASS PLATE WITH GLASS FRIT STRUCTURE

(75) Inventors: Seung-Han Lee, Yongin (KR); Jong-Seo Choi, Yongin (KR); Jin-Hwan Jeon, Yongin (KR); Sang-Wook Sin, Yongin (KR)

(73) Assignee: Samsung Display Co., Ltd. (KR)

( * ) Notice: Subject to any disclaimer, the term of this patent is extended or adjusted under 35 U.S.C. 154(b) by 431 days.

(21) Appl. No.: 12/961,404

(22) Filed: Dec. 6, 2010

(65) Prior Publication Data

US 2011/0073880 A1 Mar. 31, 2011

Related U.S. Application Data

(62) Division of application No. 11/742,078, filed on Apr. 30, 2007, now Pat. No. 7,871,949.

(30) Foreign Application Priority Data

Jan. 5, 2007 (KR) ........................ 10-2007-0001681

(51) Int. Cl.
| | | |
|---|---|---|
| *C03C 8/14* | (2006.01) | |
| *H01L 33/00* | (2010.01) | |
| *B32B 17/06* | (2006.01) | |
| *B05D 5/12* | (2006.01) | |
| *H01J 1/62* | (2006.01) | |
| *H01J 9/26* | (2006.01) | |

(52) U.S. Cl.
USPC ................. 501/17; 257/88; 257/99; 428/172; 428/410; 428/426; 427/58; 313/512; 445/25; 501/32

(58) Field of Classification Search
USPC .................... 501/17, 18, 21, 32, 41; 428/172, 428/410, 426; 427/58; 257/88, 99; 313/512; 445/24, 25
See application file for complete search history.

(56) References Cited

U.S. PATENT DOCUMENTS

| | | | |
|---|---|---|---|
| 5,882,761 | A | 3/1999 | Kawami et al. |
| 6,226,890 | B1 | 5/2001 | Boroson et al. |
| 6,555,025 | B1 | 4/2003 | Krupetsky et al. |
| 6,998,776 | B2 | 2/2006 | Aitken et al. |
| 2004/0206953 | A1 | 10/2004 | Moreno et al. |
| 2004/0207311 | A1 | 10/2004 | Cheng |
| 2004/0207314 | A1 | 10/2004 | Aitken et al. |
| 2005/0001545 | A1 | 1/2005 | Aitken et al. |
| 2005/0233885 | A1 | 10/2005 | Yoshida et al. |
| 2005/0276211 | A1 | 12/2005 | Hirotsune |
| 2006/0009109 | A1 | 1/2006 | Aitken et al. |
| 2006/0082298 | A1 | 4/2006 | Becken et al. |
| 2008/0124558 | A1 | 5/2008 | Boek et al. |

FOREIGN PATENT DOCUMENTS

| | | |
|---|---|---|
| CN | 1738776 A | 2/2006 |
| CN | 1752040 A | 3/2006 |
| EP | 1811587 A2 | 7/2007 |
| EP | 1814178 A2 | 8/2007 |
| EP | 1814188 A2 | 8/2007 |
| JP | 03-201405 | 9/1991 |
| JP | 04-132634 A | 5/1992 |
| JP | 08-075898 A | 3/1996 |
| JP | 09-186005 A | 7/1997 |
| JP | 11-116270 | 4/1999 |
| JP | 2000-264676 | 9/2000 |
| JP | 2001-048570 A | 2/2001 |
| JP | 2003-241048 A | 8/2003 |
| JP | 2006-120864 A | 5/2006 |
| JP | 2006-228358 A | 8/2006 |
| JP | 2006-524419 A | 10/2006 |
| JP | 2008-44839 A | 2/2008 |
| KR | 10-2005-0077919 A | 8/2005 |
| KR | 10-2006-0005369 | 1/2006 |
| WO | WO 93/02980 A1 | 2/1993 |
| WO | WO 2006/044383 | 4/2006 |

OTHER PUBLICATIONS

Japanese Office Action issued by the Japanese Patent Office dated Nov. 29, 2011, 4 pages.
Japanese Office Action issued by the Japanese Patent Office dated Jan. 4, 2011, 4 pages.
W.D. Johnston, Oxidation-Reduction Equilibria in Molten $NA_2O2SiO_2$ Glass, Journal, 1964, 184-190, vol. 48, No. 4, Journal of the American Ceramic Society.
A. Paul and N. Yee, Spectroscopy, Odixation-Reduction Behaviour and DC Conductivity of a Vanadium-Containing Barium Aluminoborate Glass, Journal, 1977, 259-276, vol. 24, North-Holland Publishing Company.
Search Report issued by the Twain Intellectual Property Office dated Mar. 3, 2011 corresponding to Taiwan Patent Application No. 096120064.
W.D. Johnston: "Optical Spectra of the Various Valence States of Vanadium in $Na_2O$—$2SiO_2$ Glass" Journal of the American Ceramic Society, vol. 48, No. 12, 1965, pp. 608-611, XP-002491503.
Werner Vogel: "Glaschemie," 1992, Springer-Verlag, ISBN 3540551719, XP-002491504.
C. Kasten, G. Carl, C. Russel: "The behaviour of polyvalent ions in the glass melt and their influence on the crystallization of the mica glass ceramic Bioverit II," Proceedings of the $4^{th}$ International Conference, Fundamentals of Glass Science and Technology, Sweden, 1997, pp. 298-304, XP-008094996.

(Continued)

*Primary Examiner* — Karl Group
*Assistant Examiner* — Elizabeth A Bolden
(74) *Attorney, Agent, or Firm* — Knobbe Martens Olson & Bear, LLP

(57) ABSTRACT

A light emitting device includes: a first substrate; a second substrate; a light emitting unit interposed between the first substrate and the second substrate; and a sealing material bonding the first substrate to the second substrate and sealing the light emitting unit. The sealing material comprises $V^{+4}$. In addition, a glass frit, a composition for forming a sealing material, and a method of manufacturing a light emitting device using the composition for forming a sealing material are provided to obtain the light emitting device. The sealing material of the light emitting device can be easily formed by coating and irradiation of electro-magnetic waves, so that manufacturing costs are low and deterioration of the light emitting unit occurring when sealing material is formed can be substantially prevented. The sealing material has good sealing properties and thus a light emitting device including the sealing material has a long lifetime.

19 Claims, 7 Drawing Sheets

(56) References Cited

OTHER PUBLICATIONS

G.J. Kakabadse and E. Vassiliou: "The isolation of vanadium oxides in glasses," Physics and Chemistry of Glasses, vol. 6, No. 2, 1965, pp. 33-37, XP008094997.

K. Zirkelback, R. Bruckner: "Spectroscopic investigations of barium aluminophosphate glasses containing vanadium, iron and manganese oxides" Glastechnishe Berichte, vol. 60, No. 9, 1987, pp. 312-323, XP008095000.

European Search Report dated Aug. 29, 2008 of related European Patent Application No. 07253278.1-1218 in 8 pages.

European Search Report issued on Oct. 23, 2008 of corresponding European Patent Application No. 07253278.1-1218 in 18 pages.

Chinese Office Action for Chinese Patent Application No. 200710300554.3, 10 pages, dated Sep. 26, 2010.

Registration Determination Certificate issued by the Korean Intellectual Property Office dated Nov. 28, 2012, 4 pages.

Registration Determination Certificate issued by the Chinese Intellectual Property Office dated, Jan. 2, 2013.

Office Action dated Jul. 9, 2013, received in connection with Japanese Patent Application No. 2001-095934.

GLASS PLATE WITH GLASS FRIT STRUCTURE

CROSS-REFERENCE TO RELATED PATENT APPLICATIONS

This application is a divisional application of and claims priority to U.S. application Ser. No. 11/742,078, now U.S. Pat. No. 7,871,949, filed Apr. 30, 2007 which claims the benefit of Korean Patent Application No. 10-2007-0001681, filed on Jan. 5, 2007, in the Korean Intellectual Property Office, the disclosure of both of which is incorporated herein in its entirety by reference.

BACKGROUND

1. Field

The present invention relates to a glass frit for use in packaging light emitting display devices.

2. Description of the Related Art

Electronic devices, such as an organic light emitting device, an electron emission device, or a display panel, deteriorate due to the permeation of water and/or oxygen therein. As a result, such electronic devices are necessarily encapsulated to operate stably and to have a long lifetime.

For such encapsulation of the electronic devices, a metallic can or glass is processed into a cap shape having a groove, and then a water-drying agent that absorbs water is loaded in the groove in a form of a powder, or the water-drying agent is processed into a film and then attached using a double-sided tape.

Japanese Patent Laid-open Publication No. 9-148066 discloses an organic light emitting display device including a stack structure of an organic light emitting layer formed of an organic compound interposed between a pair of facing electrodes, wherein the stack structure of the organic light emitting layer is encapsulated from external air by a sealing container, and an alkali metal oxide acting as a drying agent is disposed within the sealing container. However, the organic light emitting display device is thick due to the formation of the sealing container. In addition, even when the drying agent absorbs water and stays in a solid state, the solid drying agent becomes opaque, which is not suitable for a front emission type display device.

U.S. Pat. No. 6,226,890 discloses an organic light emitting device using a water absorbing layer which is prepared using a water absorbing agent including a solid particle having a particle size of 0.1-200 μm and a binder.

However, organic light emitting devices manufactured using these encapsulating methods do not achieve a desired lifetime. Accordingly, there is a need to improve such encapsulating methods.

SUMMARY

One aspect of the invention provides a glass fit comprising vanadium in the form of $V^{+4}$. The glass fit has a light transmittance of about 50% or less for light with the wavelength of 810 nm.

The glass frit may further comprise at least one ion selected from the group consisting of $V^{+5}$, $Ba^{+2}$, $Zn^{+2}$, $Te^{+4}$, $Fe^{+3}$, $Cu^{+2}$, $Nd^{+2}$, $K^{+1}$, $Sb^{+3}$, $P^{+5}$, $Ti^{+2}$, $Al^{+3}$, $B^{+3}$, $W^{+6}$, $Sn^{+2}$, $Bi^{+3}$, $Ca^{+2}$, $Si^{+4}$, $Zr^{+4}$, and $Mg^{+2}$. The glass frit may still further comprise $V^{+5}$, $Ba^{+2}$, $Zn^{+2}$, and $Te^{+4}$. At least part of $V^{+4}$ is formed by reducing $V^{+5}$. The glass fit may further comprise at lease one reducing agent selected from the group consisting of Sn, Al, Mg, Cu, and Zn.

The light transmittance may be about 30% or less. The light transmittance may be about 20% or less. The glass frit may have a light transmittance of about 40% or less for light with a wavelength from about 650 nm to about 1000 nm. The glass frit may have a light transmittance of about 30% or less for light with a wavelength from about 650 nm to about 1000 nm. The glass fit may have a light transmittance of about 20% or less for light with a wavelength from about 650 nm to about 1000 nm.

Another aspect of the invention provides a glass frit comprising vanadium in the form of $V^{+4}$. The glass frit has a light transmittance of about 50% or less for light with the wavelength of 810 nm.

The glass frit may further comprise at least one ion selected from the group consisting of $V^{+5}$, $Ba^{+2}$, $Zn^{+2}$, $Te^{+4}$, $Fe^{+3}$, $Cu^{+2}$, $Nd^{+2}$, $K^{+1}$, $Sb^{+3}$, $P^{+6}$, $Ti^{+2}$, $Al^{+3}$, $B^{+3}$, $W^{+6}$, $Sn^{+2}$, $Bi^{+3}$, $Ca^{+2}$, $Si^{+4}$, $Zr^{+4}$, and $Mg^{+2}$. The glass frit may still further comprise $V^{+5}$, $Ba^{+2}$, $Zn^{+2}$, and $Te^{+4}$. At least part of $V^{+4}$ is formed by reducing $V^{+5}$. The glass frit may further comprise at lease one reducing agent selected from the group consisting of Sn, Al, Mg, Cu, and Zn.

The light transmittance may be about 30% or less. The light transmittance may be about 20% or less. The glass frit may have a light transmittance of about 40% or less for light with a wavelength from about 650 nm to about 1000 nm. The glass fit may have a light transmittance of about 30% or less for light with a wavelength from about 650 nm to about 1000 nm. The glass frit may have a light transmittance of about 20% or less for light with a wavelength from about 650 nm to about 1000 nm.

According to still another aspect of the invention, the glass frit may be in the form a powder, a paste, or a sintered body. The sintered body may be dark, and substantially translucent. The $V^{+4}$ may exist in the glass frit in an amount from about 0.0001 wt % to about 10 wt %. $V^{+4}$ may exist in the glass fit in an amount from about 0.0001 wt % to about 5 wt %, from about 0.0005 wt % to about 5 wt %, from about 0.001 wt % to about 5 wt %, from about 0.01 wt % to about 5 wt %, from about 0.01 wt % to about 1 wt %, or from about 0.1 wt % to about 1 wt %. $V^{+4}$ may exist in the glass frit in an amount of about 0.0001 wt %, about 0.0005 wt %, about 0.001 wt %, about 0.005 wt %, about 0.01 wt %, about 0.05 wt %, about 0.1 wt %, about 0.5 wt %, about 1 wt %, about 5 wt %, about 10 wt %, or about 50 wt %. $V^{+4}$ may exist in the glass fit in an amount within a range formed by two of the foregoing numbers.

According to still another aspect of the invention, the $V^{+4}$ may exist more on a surface of the sintered body than the interior thereof. The sintered body may be formed by baking a paste form of the glass frit. The sintered body may further be heated by further illuminating a laser beam thereon. The presence of the $V^{+4}$ in the glass frit composition may be detectable by X-ray Photoelectron Spectroscopy (XPS).

The glass frit may further comprise at least one filler selected from the group consisting of a zirconium-tungsten-phosphate based filler, a zirconium-phosphate based filler, a zirconium-based filler, an eucrytite-based filler, a cordierite-based filler, alumina, silica, zinc silicate, and aluminum titanate. The filler may have an average particle diameter from about 0.1 μm, to about 30 μm. A thermal expansion coefficient of the composition may be in the range from about $25 \times 10^{-7}$/° C., to about $95 \times 10^{-7}$/° C.

The glass frit may further comprise at least one resin selected from the group consisting of an acryl-based resin, a methacryl-based resin, a vinyl-based resin, an epoxy-based resin, a urethane-based resin, and a cellulose-based resin, and further comprising at least one solvent selected from the group consisting of terpinol, dihydro terpinol, butylcarbitolacetate, butyl carbitol, and 2,2,4-trimethyl-1,3-pentadiol monobutyrate.

According to still another aspect of the invention, a glass frit device may comprise a glass plate comprising a surface; and a glass frit composition, and the glass frit may form a closed loop on the surface of the glass plate. The sintered body may have light transmittance of 40% or less for light at a wavelength 810 nm. The sintered body may have light transmittance of 40% or less for light at a wavelength from about 650 nm to about 1000 nm.

According to still another aspect of the invention, a method of manufacturing a glass frit device comprises: providing the glass plate comprising the surface; forming a closed loop structure of a paste composition; heating the closed loop structure so as to form the glass frit forming a closed loop on the surface, and the glass frit comprises $V^{+4}$ and has a light transmittance of about 50% or less for light at the wavelength of 810 nm.

According to still another aspect of the invention, a method of making a display device comprises: providing the glass frit device; providing an intermediate device comprising a substrate and an array of light emitting devices formed on the substrate; arranging the glass frit device and the intermediate device such that the glass frit is interposed between the glass plate and the substrate, and that the glass frit contacts the substrate wile surrounding the array; and applying laser onto the glass fit so as to bond the glass frit to the substrate. The transmittance of the laser may be about 40% or less.

According to still another aspect of the invention, a display device comprises: a first substrate; a second substrate; an array of light emitting devices interposed between the first substrate and the second substrate; and the glass frit, and the glass frit is interposed between and bonds the first substrate to the second substrate. The light emitting device may comprise an organic light emitting diode.

The glass frit may have a light transmittance of about 50% or less for light with a wavelength of 810 nm or from about 650 nm to about 1000 nm. The glass frit may have a light transmittance of about 55% or less, about 54% or less, about 53% or less, about 52% or less, about 51% or less, about 50% or less, about 49% or less, about 48% or less, about 47% or less, about 46% or less, about 45% or less, about 44% or less, about 43% or less, about 42% or less, about 41% or less, about 40% or less, about 39% or less, about 38% or less, about 37% or less, about 36% or less, about 35% or less, about 34% or less, about 33% or less, about 32% or less, about 31% or less, about 30% or less, about 29% or less, about 28% or less, about 27% or less, about 26% or less, about 25% or less, about 24% or less, about 23% or less, about 22% or less, about 21% or less, about 20% or less, about 19% or less, about 18% or less, about 17% or less, about 16% or less, about 15% or less, about 14% or less, about 13% or less, about 12% or less, about 11% or less, about 10% or less, about 9% or less, about 8% or less, about 7% or less, about 6% or less, about 5% or less, about 4% or less, about 3% or less, about or 2%, for a light with a wavelength of 810 nm or from about 650 nm to about 1000 nm. The light transmittance has ranges formed by two of the forgoing numbers.

One aspect of the present invention provides a light emitting device having a long lifetime and using a sealing material having good sealing properties.

Another aspect of the present invention also provides a glass fit and a composition for forming a sealing material to manufacture the light emitting device, and a method of manufacturing a light emitting device.

According to an aspect of the present invention, there is provided a glass frit including $V^{+4}$. According to another aspect of the present invention, there is provided a composition for forming a sealing material including a glass frit having $V^{+4}$. The composition for forming a sealing material may further include a zirconium-tungsten-phosphate based filler. According to another aspect of the present invention, there is provided a composition for forming a sealing material including a glass frit having $V^{+5}$ and a zirconium-tungsten-phosphate based filler. According to another aspect of the present invention, there is provided a light emitting device including: a first substrate; a second substrate; a light emitting unit interposed between the first substrate and the second substrate; and a sealing material bonding the first substrate to the second substrate and sealing the light emitting unit, wherein the sealing material includes $V^{+4}$. The sealing material of the light emitting device may be formed by irradiation of electromagnetic waves in a wavelength range of 200 nm-10,000 nm.

According to another aspect of the present invention, there is provided a method of manufacturing a light emitting device, the method including: preparing a first substrate on which a light emitting unit is formed; preparing the composition for forming a sealing material described above; depositing the composition for forming a sealing material to an area in which a sealing material is to be formed on a second substrate; heat treating the second substrate on which the composition for forming a sealing material is deposited, thereby forming heat-treated composition for forming a sealing material; coupling the first substrate to the second substrate such that the heat-treated composition for forming a sealing material and the light emitting unit are interposed between the first substrate and the second substrate; and irradiating electro-magnetic waves on the heat-treated composition for forming a sealing material to form a sealing material.

By using the glass fit, the composition for forming a sealing material, and the method of manufacturing a light emitting device, the sealing material having good sealing property can be obtained, deterioration of the light emitting unit occurring when the sealing material is formed can be prevented, and a light emitting device having a long lifetime can be obtained at low costs.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Figure 1:
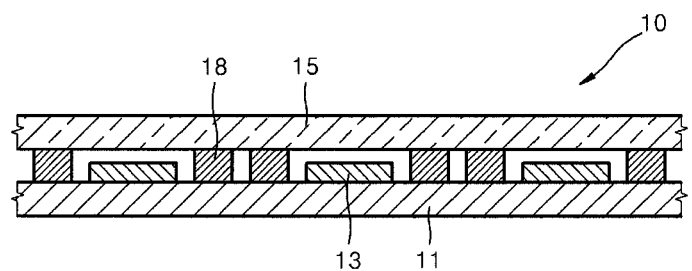
FIG. 1 is a schematic sectional view of a light emitting device according to an embodiment of the present invention.

Various embodiments of the present invention will now be described more fully with reference to the accompanying drawings.

A glass frit, which is an oxide including at least one kind of an ion, according to an embodiment of the present invention, includes $V^{+4}$. The $V^{+4}$ of the glass fit absorbs electro-magnetic waves having various wavelengths, so that the glass frit having the $V^{+4}$ can be softened by irradiation of electro-magnetic waves. For example, the $V^{+4}$ can absorb laser light having a wavelength of 810 nm.

The glass fit can further include other ions, in addition to the $V^{+4}$. For example, the glass frit can include at least one ion selected from the group consisting of $V^{+6}$, $Ba^{+2}$, $Zn^{+2}$, $Te^{+4}$, $Fe^{+3}$, $Cu^{+2}$, $Nd^{+2}$, $K^{+1}$, $Sb^{+3}$, $P^{+5}$, $Ti^{+2}$, $Al^{+3}$, $B^{+3}$, $W^{+6}$, $Sn^{+2}$, $Bi^{+3}$, $Ca^{+2}$, $Si^{+4}$, $Zr^{+4}$, and $Mg^{+2}$. However, the glass fit is not limited thereto.

In particular, the glass frit can further include $V^{+6}$, $Ba^{+2}$, $Zn^{+2}$, and $Te^{+4}$; or the glass fit can further include a $Ba^{+2}$, $Zn^{+2}$, and $Te^{+4}$.

Some of the ions included in the glass fit can be induced from a reductant that reduces $V^{+6}$ included in the glass frit into $V^{+4}$. For example, $Al^{+3}$, $Sn^{+2}$, $Mg^{+2}$, $Cu^{+2}$, or a $Zn^{+2}$ can be induced from Al, Sn, Mg, Cu, or Zn, which are reductants that reduce $V^{+6}$ included in the glass frit into $V^{+4}$ and are added when the glass frit is manufactured. In addition, the reductant that reduces $V^{+6}$ included in the glass frit into $V^{+4}$ can also be C (carbon). When the reductant is C, a small amount of organic materials can remain in the glass frit.

The glass frit may have an average particle size of 0.1 μm-30 μm, more specifically, 0.5 μm-15 μm to effectively absorb electro-magnetic waves. The largest particle size of the glass fit may be in the range of 1 μm-150 μm, more specifically, 3 μm-30 μm.

A method of manufacturing the glass frit having $V^{+4}$ described above will now be described in detail.

An oxide, such as $V_2O_5$, and a reductant that reduces $V^{+5}$ into $V^{+4}$ are mixed. The oxide can be $V_2O_5$, BaO, ZnO, $TeO_2$, $Fe_2O_3$, CuO, NdO, $K_2O$, $Sb_2O_3$, $P_2O_5$, TiO, $Al_2O_3$, $B_2O_3$, $WO_6$, SnO, $Bi_2O_3$, CaO, $SiO_2$, or $ZrO_2$, not limited thereto. The reductant can be Al, Sn, Mg, Cu, Zn, or C, however, the reductant is not limited thereto.

Then, the mixture of the reductant and the oxide is heat treated in a melting pot. The heat treatment temperature may vary according to the kind and amount of oxide and reductant that are to be melted. For example, the heat treatment can be performed at approximately 600° C.-1200° C. for 10-240 minutes. The melted product is cooled to yield glass and then the glass is ground to obtain a glass frit having $V^{+4}$. The glass frit having $V^{+4}$ may be included in a composition for forming a sealing material of a light emitting device. The glass fit having $V^{+4}$ has been described.

The composition for forming a sealing material of a light emitting device includes the glass fit having $V^{+4}$, and thus the composition can absorb electro-magnetic waves in the wavelength range of 200 nm-10,000 nm. Accordingly, the composition for forming a sealing material of a light emitting device can be effectively softened by irradiation of electro-magnetic waves in the wavelength range of 200 nm-10,000 nm.

When the composition for forming a sealing material is softened by irradiation of electro-magnetic waves, the volume of the composition for forming a sealing material of a light emitting device can be increased and thus, a sealing material having good sealing properties may not be obtained. Accordingly, the composition for forming a sealing material of a light emitting device may further include a filler that lowers a thermal expansion coefficient.

The filler that lowers a thermal expansion coefficient can be a zirconium-tungsten-phosphate based filler; a zirconium-phosphate based filler, such as zirconium phosphate; a zirconium-based filler, such as zirconium; an eucrytite-based filler, such as β-eucrytite; a cordierite-based filler; alumina; silica; zinc silicate; aluminum titanate; or a combination of at least two of these, however, the filler is not limited thereto.

More specifically, the zirconium-tungsten-phosphate based filler can be $(Zr_2(WO_4)(PO_4)_2)$, however, the filler is not limited thereto.

The filler included in the composition for forming a sealing material of a light emitting device may be softened by irradiation of electro-magnetic waves. In terms of the softening of the filler, the average particle diameter of the filler may be in the range of 0.1 μm-30 μm, more specifically, 0.5 μm-15 μm. The largest particle diameter of the filler may be in the range of 1 μm-150 μm, more specifically, 3 μm-30 μm.

The thermal expansion coefficient of the composition for forming a sealing material of a light emitting device may be in the range of $25 \times 10^{-7}/°$ C.$-95 \times 10^{-7}/°$ C., more specifically, $35 \times 10^{-7}/°$ C.$-65 \times 10^{-7}/°$ C. Therefore, a misalignment of substrates due to a change in volume of the composition resulting from irradiation of electro-magnetic waves when the sealing materials of the light emitting device are formed can be prevented.

The amount of filler may be determined in consideration of the thermal expansion coefficient range and a sufficient amount of glass frit that is required. For example, the amount of filler may be in the range of 5 parts by weight-80 parts by weight, more specifically, 20 parts by weight-60 parts by weight, based on 100 parts by weight of the total amount of glass frit and filler.

The composition for forming a sealing material of a light emitting device may further include a vehicle so as to obtain sufficient printing, viscosity, and flowing properties. The vehicle can be an organic material so that the vehicle can decompose when the composition for forming a sealing material of a light emitting device is loaded onto a substrate and then heat treated.

For example, the vehicle may include a resin and a solvent. The resin may include at least one resin selected from the group consisting of an acryl-based resin, a methacryl-based resin, a vinyl-based resin, an epoxy-based resin, a urethane-based resin, and a cellulose-based resin. However, the resin is not limited thereto. The solvent may include at least one compound selected from the group consisting of terpinol, dihydro terpinol, butylcarbitolacetate, butyl carbitol, and 2,2, 4-trimethyl-1,3-pentadiol monobutyrate. However, the solvent is not limited thereto.

More specifically, the acryl-based resin of the vehicle can be butylacrylate or ethylhexylacrylate; the methacryl-based resin of the vehicle can be propyleneglycolmethacrylate or tetrahydrofurfuryl methacrylate; the vinyl-based resin of the vehicle can be vinylacetate, N-vinylpyrrolidone; the epoxy-based resin of the vehicle can be cycloaliphatic epoxide or epoxy acrylate; the urethane-based resin of the vehicle can be urethane acrylate; and the cellulose-based resin of the vehicle can be ethylcellulose or cellulosenitrate. However, these resins of the vehicle are not limited thereto.

The amount of vehicle of the composition may be determined in consideration of printing, viscosity, and flowing properties of the composition for forming a sealing material of a light emitting device. For example, the amount of vehicle of the composition may be in the range of 10 parts by weight-60 parts by weight, more specifically, 20 parts by weight-50 parts by weight based on 100 parts by weight of the composition for forming a sealing material of a light emitting device.

Another composition for forming a sealing material of a light emitting device according to another embodiment of the present invention includes a glass frit having $V^{+5}$ and a filler. In this case, the filler of the composition can be a zirconium-tungsten-phosphate based filler.

In the current embodiment, the term, "the glass frit having $V^{+5}$" means a glass frit which does not include $V^{+4}$. The sealing material of the light emitting device necessarily include $V^{+4}$, however, the sealing material can include the $V^{+4}$ obtained according to various methods. For example, as described above, the glass frit itself may include the $V^{+4}$. Alternatively, even when a glass fit does not include $V^{+4}$, $V^{+5}$ can be reduced into the $V^{+4}$ by using a reductant or by performing a heat treatment in a reducing atmosphere. In detail, even when the composition for forming a sealing material of a light emitting device including the glass frit having the $V^{+5}$ and the filler includes a glass frit that does not include $V^{+4}$, the $V^{+4}$ can be obtained by using a reductant or by performing a heat treatment in a reducing atmosphere.

The glass frit having $V^{+5}$ of the composition for forming a sealing material of a light emitting device may further include at least one ion selected from the group consisting of a $Ba^{+2}$, $Zn^{+2}$, $Te^{+4}$, $Fe^{+3}$, $Cu^{+2}$, $Nd^{+2}$, $K^{+1}$, $Sb^{+3}$, $P^{+5}$, $Ti^{+2}$, $Al^{+3}$, $B^{+3}$, $W^{+6}$, $Sn^{+2}$, and $Bi^{+3}$, $Ca^{+2}$, $Si^{+4}$, $Zr^{+4}$, and $Mg^{+2}$. However, the glass frit having $V^{+5}$ is not limited thereto.

More specifically, the glass frit having $V^{+5}$ may include a $Ba^{+2}$, $Zn^{+2}$, and $Te^{+4}$.

The glass frit having $V^{+5}$ may have an average particle diameter of 0.1 μm-30 μm, more specifically, 0.5 μm-15 μm so as to effectively absorb electro-magnetic waves. The largest particle diameter of the glass frit having $V^{+5}$ may be in the range of 1-150 μm, more specifically, 3 μm-30 μm.

The zirconium-tungsten-phosphate based filler included in the composition for forming a sealing material can be ($Zr_2(WO_4)(PO_4)_2$), however, the zirconium-tungsten-phosphate based filler is not limited thereto.

The composition for forming a sealing material of a light emitting device may further include a filler selected from a zirconium-phosphate based filler, such as, zirconium phosphate; a zirconium-based filler, such as zirconium; an eucrytite-based filler, such as β-eucrytite; a cordierite-based filler; alumina; silica; zinc silicate; and aluminum titanate, however, the filler is not limited thereto.

The filler included in the composition for forming a sealing material of a light emitting device may be softened by irradiation of electro-magnetic waves. In terms of the softening of the filler, the average particle diameter of the filler may be in the range of 0.1 μm-30 μm, more specifically, 0.5 μm-30 μm. The largest particle diameter of the filler may be in the range of 1-150 μm, more specifically, 3 μm-30 μm.

A thermal expansion coefficient of the composition for forming a sealing material of a light emitting device may be in the range of $25 \times 10^{-7}/°C.-95 \times 10^{-7}/°C.$, more specifically, $35 \times 10^{-7}/°C.-65 \times 10^{-7}/°C.$ Therefore, a misalignment of substrates due to a change in volume of the composition resulting from irradiation of electro-magnetic waves when the sealing material of the light emitting device is manufactured can be prevented.

The amount of filler may be determined in consideration of the thermal expansion coefficient range and a sufficient amount of glass frit that is required. For example, the amount of filler may be in the range of 5 parts by weight-80 parts by weight, more specifically, 20 parts by weight-60 parts by weight, based on 100 parts by weight of the total amount of glass frit and filler.

The composition for forming a sealing material of a light emitting device including a glass fit having $V^{+5}$ and a filler may further include a reductant. The reductant reduces the $V^{+5}$ into $V^{+4}$. The composition for forming a sealing material of a light emitting device is coated on a substrate, heat treated, and then subjected to irradiation of electro-magnetic waves. When the composition is heat treated, the $V^{+5}$ of the glass frit can be reduced into $V^{+4}$ by the reductant included in the composition for forming a sealing material.

The reductant of the composition can be Al, Sn, Mg, Cu, Zn, or C, however, the reductant of the composition is not limited thereto. The amount of reductant may vary according to the amount of glass frit, and the heat treatment temperature of the composition and heat treatment time of the composition for forming a sealing material of a light emitting device may vary, and the amount of reductant of the composition can be in the range of approximately 0.01 parts by weight-20 parts by weight, more specifically, 0.1 parts by weight-2 parts by weight, based on 100 parts by weight of the glass frit.

The composition for forming a sealing material of a light emitting device may further include a vehicle so as to obtain sufficient printing, viscosity, and flowing properties. The vehicle of the composition can be an organic material so that the vehicle of the composition can decompose when the composition for forming a sealing material of a light emitting device is loaded onto a substrate and then heat treated.

For example, the vehicle of the composition may include a resin and a solvent. The resin of the vehicle may include at least one resin selected from the group consisting of an acryl-based resin, a methacryl-based resin, a vinyl-based resin, an epoxy-based resin, a urethane-based resin, and a cellulose-based resin. However, the resin of the vehicle is not limited thereto. The solvent of the vehicle may include at least one compound selected from the group consisting of terpinol, dihydro terpinol, butylcarbitolacetate, butyl carbitol, and 2,2, 4-trimethyl-1,3-pentadiol monobutyrate. However, the solvent of the vehicle is not limited thereto.

Some of the vehicles described above can act as a reductant that reduces $V^{+5}$ into $V^{+4}$.

More specifically, the acryl-based resin can be butylacrylate or ethylhexylacrylate; the methacryl-based resin can be propyleneglycolmethacrylate or tetrahydrofurfuryl methacrylate; the vinyl-based resin can be vinylacetate, N-vinylpyrrolidone; the epoxy-based resin can be cycloaliphatic epoxide or epoxy acrylate; the urethane-based resin can be urethane acrylate; and the cellulose-based resin can be ethylcellulose or cellulosenitrate. However, these resins are not limited thereto.

The amount of vehicle may be determined in consideration of printing, viscosity, and flowing properties of the composition for forming a sealing material of a light emitting device. For example, the amount of vehicle may be in the range of 10 parts by weight-60 parts by weight, more specifically, 20 parts by weight-50 parts by weight, based on 100 parts by weight of the composition for forming a sealing material of a light emitting device.

As described above, the composition for forming a sealing material including a glass frit having $V^{+4}$, and the composition for forming a sealing material including a glass fit having $V^{+5}$ ion can be used to form a sealing material that encapsulate an electronic device, such as an organic light emitting device, an electron emission device, or a plasma display panel, so as to prevent permeation of oxygen and/or water therein.

However, the glass fit having $V^{+4}$ ion of the composition for forming a sealing material including a glass frit having $V^{+4}$ ion can further include $V^{+5}$ ion in addition to the $V^{+4}$ ion. Accordingly, as required, the composition for forming a sealing material including a glass fit having $V^{+4}$ ion can further include a reductant which can be added to the composition for forming sealing materials including a glass fit having $V^{+5}$, so that residual $V^{+5}$ can be additionally reduced.

A light emitting device according present invention include a first substrate; a second substrate; a light emitting unit interposed between the first substrate and the second substrate; and a sealing material bonding the first substrate to the second substrate and sealing the light emitting unit, wherein the sealing material includes V.

FIG. 1 is a schematic sectional view of a light emitting device 10 including a plurality of light emitting units 13 such as organic light emitting units, according to an embodiment of the present invention.

Referring to FIG. 1, the light emitting device 10 includes a first substrate 11, a second substrate 15, and the light emitting units 13 formed on the first substrate 11. In the light emitting device 10 of FIG. 1, the second substrate 15 acts as an encapsulation substrate. Each of a plurality of sealing materials 18 bonding the first substrate 11 to the second substrate 15 and sealing each of the light emitting units 13, are interposed between the first substrate 11 and the second substrate 15. Each of the sealing materials 18 includes $V^{+4}$.

The first substrate 11 can be any substrate that is commercially used in light emitting devices. For example, the first substrate 11 can be a glass substrate, a metallic substrate, a plastic substrate, or the like, however, the first substrate 11 is not limited thereto.

The light emitting units 13 are formed on the first substrate 11.

Figure 2:
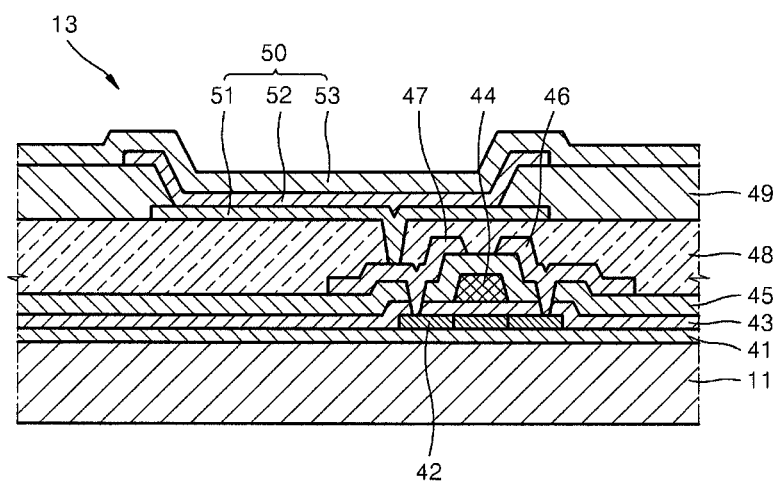
FIG. 2 is a schematic sectional view of one of a plurality of light emitting units of the light emitting device of FIG. 1, according to an embodiment of the present invention.

FIG. 2 is a schematic sectional view of one of the light emitting units 13 of the light emitting device 10 of FIG. 1, according to an embodiment of the present invention. More specifically, the light emitting units 13 are of an active matrix (AM) type.

Referring to FIG. 2, a buffer layer 41 is formed on the substrate 11 in order to flatten the substrate 11 and to prevent permeation of impure atoms. The buffer layer 41 can be formed of at least one of $SiO_2$ and SiNx, however, the buffer layer 41 can be formed of other materials.

A thin film transistor (TFT) is formed on the substrate 11 and can be comprised in each pixel of the light emitting device 10.

More specifically, a semiconductor layer 42 having a predetermined pattern is formed on the buffer layer 41. The semiconductor layer 42 may be formed of an inorganic semiconducting material, such as an amorphous silicon or a poly silicon, or an organic semiconducting material, such as pentacene, and may include a source region, a drain region, and a channel region.

A gate insulating layer 43 formed of $SiO_2$ or SiNx is formed on the semiconductor layer 42, and a gate electrode 44 is formed on the gate insulating layer 43. The gate electrode 44 may be formed of MoW or Al/Cu, however, the gate electrode 44 can be formed of other materials. The material of the gate electrode 44 can be determined in consideration of an adherence of the gate electrode 44 with an adjacent layer, flatness of a layer that is to-be-deposited on the gate electrode 44, electrical resistance of the gate electrode 44, and processability of the gate electrode 44. The gate electrode 44 is connected to a gate line that applies a TFT on/off signal (not shown).

An interlayer insulating layer 45 is formed on the gate electrode 44, and a source electrode 46 and a drain electrode 47 are formed on the interlayer insulating layer 45. The source electrode 46 and the drain electrode 47 can be formed of Au; Pd; Pt; Ni; Rh; Ru; Ir; Os; Al; Mo; an alloy formed of at least two kinds of metals, such as an Al:Nd alloy or a MoW alloy; or a metal oxide, such as ITO, IZO, NiO, $Ag_2O$, $In_2O_3$—$Ag_2O$, $CuAlO_2$, $SrCu_2O_2$, or Zr-coated ZnO, however, the source electrode 46 and the drain electrode 47 are not limited thereto. In addition, the source electrode 46 and the drain electrode 47 can be formed of a combination of at least two selected from the metals and metal oxides described above.

The source electrode 46 and the drain electrode 47 are electrically connected to the source and drain regions of the semiconductor layer 42 through a contact hole, respectively. A passivation layer 48 is formed on the TFT described above.

The passivation layer 48 may include at least one of an inorganic and an organic material. The inorganic material can be $SiO_2$, SiNx, SiON, $Al_2O_3$, $TiO_2$, $Ta_2O_5$, $HfO_2$, $ZrO_2$, BST, or PZT. The organic material can be a polymer, such as PMMA or PS; a polymer derivative including a phenol group; an acryl-based polymer; an imide-based polymer; an arylether-based polymer; an amide-based polymer; a fluoride-containing polymer; a p-xylene-based polymer; a vinylalcohole-based polymer; or a blend of these, however, the organic material is not limited thereto. The passivation layer 48 may have a composite stack structure consisting of an inorganic insulating layer and an organic insulating layer.

A first electrode 51 acting as an anode of an organic light emitting unit 50 is formed on the passivation layer 48. The first electrode 51 of the organic light emitting unit 50 can be a transparent electrode formed of, for example, a material having a high work function, such as ITO, IZO, ZnO, or $In_2O_3$. Alternatively, the first electrode 51 of the organic light emitting unit 50 can be a reflective electrode formed by forming a reflective layer formed of Ag, Mg, Al, Pt, Pd, Au, Ni, Nd, Ir, Cr, Li, Ca, or a combination of these, and then depositing ITO, IZO, ZnO, or $In_2O_3$, each of which has a high work function, on the reflective layer of the reflective electrode. The first electrode 51 of the organic light emitting unit 50 is electrically connected to the drain electrode 47 of the TFT described above.

A pixel define layer 49 is formed on the first electrode 51. The pixel define layer 49 exposes a part of the first electrode 51 and has an opening defining where an organic layer 52 of the organic light emitting unit 50 is formed. The organic layer 52 of the organic light emitting unit 50 is formed in the opening defined by the pixel define layer 49 and a second electrode 53 acting as a cathode of the organic light emitting unit 50 is formed on the organic layer 52.

The organic layer 52 that is interposed between the first electrode 51 and the second electrode 53 emits light by an electrical operation of the first electrode 51 and the second electrode 53. The organic layer 52 may be formed with a low molecular weight or high molecular weight organic material. The organic layer 52 may include at least one layer selected from the group consisting of a hole injection layer, a hole transport layer, an electron blocking layer, an emission layer, a hole blocking layer, an electron transport layer, and an electron injection layer, as required. The low molecular weight organic material of the organic layer 52 can be copper phthalocyanine (CuPc), N,N'-Di naphthalene-1-yl-N,N'-diphenyl-benzidine (NPB), tris-8-hydroxyquinoline aluminum (Alq3), or the like, however, the low molecular weight organic material of the organic layer 52 is not limited thereto. The high molecular weight organic material of the organic layer 52 can be poly-2,4-ethylene-dihydroxy thiophene (PEDOT), polyaniline (PANI), or the like, however, the high molecular weight organic material of the organic layer 52 is not limited thereto. The organic layer 52 can be formed by various other methods, such as deposition, LITI (Laser Induced Thermal Imaging), inkjet printing, or spin coating.

The second electrode 53 can be a transparent electrode or reflective electrode formed of a material having a low work function, such as Ag, Mg, Al, Pt, Pd, Au, Ni, Nd, Ir, Cr, Li, or Ca. In addition, an assistant electrode or bus electrode line can be further in addition to the transparent electrode or the reflective electrode using a transparent conductive material, such as ITO, IZO, ZnO, or $In_2O_3$.

A protective layer (not shown) can be further formed on the second electrode 53 to provide resistance to heat, and chemical materials, and the permeation of water, so that the permeation of water and/or oxygen into the organic layer 52 can be additionally prevented. The protective layer may have various other structures. For example, the protective layer may include an inorganic layer or include an alternative structure of an inorganic layer and an organic layer.

The inorganic layer of the protective layer may include at least one oxide selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxide nitride (SiON). However, the inorganic layer can be formed of other materials.

The organic layer of the protective layer can be formed of a cross-linked product of a benzocyclobutene ring-containing compound or hydrosilsesquioxane, however, the organic layer of the protective layer can be formed of other materials.

The inorganic layer and organic layer of the protective layer are described in detail in Korean Patent Laid-open Publication No. 2005-0077919, which is referred and incorporated in the current specification.

One of the light emitting units 13 of the light emitting device 10 according to an embodiment of the present invention has been described with reference to FIG. 2, however, the light emitting units 13 of the light emitting device 10 can have various other structures.

In the light emitting device 10 of FIG. 1, the second substrate 15 can be an encapsulation substrate such as a glass substrate or a transparent plastic substrate. When the second substrate 15 is a plastic substrate, a protective film can be formed on an inner surface of the plastic substrate in order to prevent the permeation of water. The protective film of the transparent plastic substrate has a resistance to heat, and chemical materials, and prevents the permeation of water. When the encapsulation substrate of the second substrate 15 is formed of a transparent material, such a structure is suitable for a front emission type light emitting device.

The sealing materials 18 bond the first substrate 11 to the second substrate 15 and seal the light emitting units 13, in particular, to prevent the permeation of oxygen and water into the light emitting units 13 by being interposed between the first substrate 11 and the second substrate 15.

Each of the sealing materials 18 includes $V^{+4}$. The $V^{+4}$ of each of the sealing materials 18 can effectively absorb electro-magnetic waves in the wavelength range of 200 nm-10,000 nm, such as ultraviolet rays, visible rays, or infrared rays.

In terms of the absorption of electro-magnetic waves, the amount of $V^{+4}$ included in each of the sealing materials 18 may be in the range of 0.001 mol %-50 mol %, more specifically, 0.01 mol %-30 mol %. The sealing materials 18 can be formed using a laser or a light-emitting lamp. The laser or the light-emitting lamp that is used to form the sealing materials 18 can selectively irradiate electro-magnetic waves to an area in which the sealing materials 18 are each formed, so that the light emitting units 13 of the light emitting device 10 do not substantially deteriorate when the sealing materials 18 are formed.

Each of the sealing materials 18 may further include a filler.

The filler of each of the sealing materials 18 lowers the thermal expansion coefficient of the composition for forming the sealing materials.

The filler of each of the sealing materials 18 can be a zirconium-tungsten-phosphate based filler; a zirconium-phosphate based filler, such as zirconium phosphate; a zirconium-based filler, such as zirconium; an eucrytite-based filler, such as β-eucrytite; a cordierite-based filler; alumina; silica; zinc silicate; aluminum titanate; or a combination of at least two of these, however, the filler of each of the sealing materials 18 is not limited thereto.

More specifically, the zirconium-tungsten-phosphate based filler can be $(Zr_2(WO_4)(PO_4)_2)$, however, the zirconium-tungsten-phosphate based filler is not limited thereto.

The filler of each of the sealing materials 18 may be softened by irradiation of electro-magnetic waves. In terms of the softening of the filler, the average particle diameter of the filler is in the range of 0.1 μm-30 μm, more specifically, 0.5 μm-15 μm. The largest particle size of the filler may be in the range of 1 μm-150 μm, more specifically, 3 μm-30 μm.

The amount of filler may be determined in consideration of a thermal expansion coefficient range and a sufficient amount of the glass frit that is required. For example, the amount of filler may be in the range of 5 parts by weight-80 parts by weight, more specifically, 20 parts by weight-60 parts by weight, based on 100 parts by weight of the total amount of glass frit and filler.

Each of the sealing materials 18 may further include, in addition to the $V^{+4}$, various other ions. For example, each of the sealing materials 18 may further include at least one ion selected from the group consisting of $V^{+5}$, $Ba^{+2}$, $Zn^{+2}$, $Te^{+4}$, $Fe^{+3}$, $Cu^{+2}$, $Nd^{+2}$, $K^{+1}$, $Sb^{+3}$, $P^{+5}$, $Ti^{+2}$, $Al^{+3}$, $B^{+3}$, $W^{+6}$, $Sn^{+2}$, $Bi^{+3}$, $Ca^{+2}$, $Si^{+4}$, $Zr^{+4}$, and $Mg^{+2}$. However, each of the sealing materials 18 is not limited thereto.

More specifically, each of the sealing materials 18 may further include $V^{+5}$, $Ba^{+2}$, $Zn^{+2}$, and $Te^{+4}$, or include a $Ba^{+2}$, $Zn^{+2}$, and $Te^{+4}$.

Some of the ions included in each of the sealing materials 18 can be induced from a reductant that reduces $V^{+6}$ included in the glass frit into $V^{+4}$. For example, $Al^{+3}$, $Sn^{+2}$, $Mg^{+2}$, $Cu^{+2}$, and $Zn^{+2}$ can be induced from Al, Sn, Mg, Cu, and Zn, each of which is a reductant that reduces $V^{+5}$ included in the glass frit into $V^{+4}$, and is added when a glass frit is manufactured. Meanwhile, each of the sealing materials 18 can include a small amount of an organic material induced from C (carbon) that is used as a reductant that reduces $V^{+6}$ into $V^{+4}$.

A method of manufacturing the light emitting device 10 described above according to an embodiment of the present invention will now be described in detail with reference to FIGS. 3A through 3G.

Figure 3A:
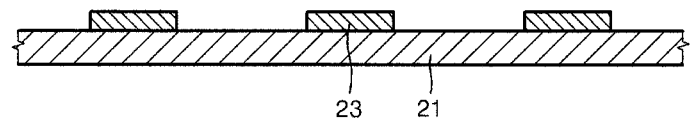
FIGS. 3A through 3G are views illustrating a method of manufacturing a light emitting device according to an embodiment of the present invention.

Referring to FIG. 3A, a first substrate 21 on which a plurality of light emitting units 23 are formed is prepared. The first substrate 21 can be any substrate that is used in various electronic devices, as described above, and the light emitting units 23 can be organic light emitting units, however, the light emitting units 23 are not limited thereto. The light emitting units 23 can be manufactured using a commercially known method.

Figure 3B:
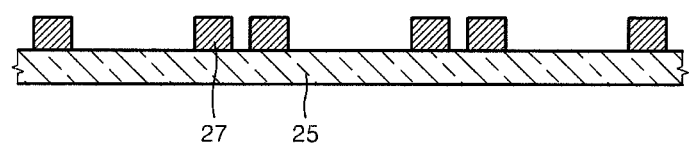
Figure 3C:
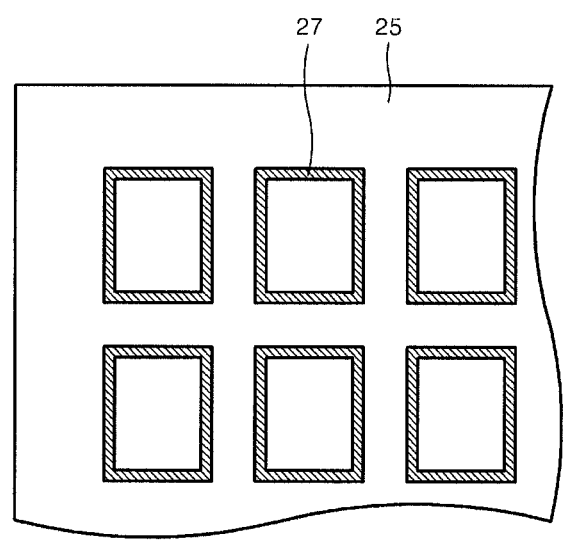

Referring to FIGS. 3B and 3C, a composition for forming a sealing material 27 is provided to areas where the sealing materials (see reference number 28 in FIG. 3G) are to be formed on a second substrate 25. The composition for forming a sealing material 27 are provided to respectively surround the organic light emitting units 23 after the first substrate 21 is coupled to the second substrate 25. However, the areas where the sealing materials are to be formed on the second substrate are not limited to the areas shown in FIGS. 3B and 3C. FIG. 3B is cross-sectional view of FIG. 3C. The second substrate 25 can be encapsulation substrate and can be formed from glass or plastic materials.

The composition for forming a sealing material 27 can be the composition for forming a sealing material including a glass fit having $V^{+4}$ or the composition for forming a sealing material including a glass frit having $V^{+5}$ and a filler as described above.

The composition for forming a sealing material 27 can be provided on the second substrate 25 using various known methods, such as an inkjet printing method or a screen printing method.

The composition for forming a sealing material 27 may or may not include $V^{+4}$. For example, when the composition for forming a sealing material 27 includes a glass frit having $V^{+4}$, the composition for forming a sealing material 27 includes the V. However, when the composition for forming a sealing material 27 does not include a glass frit having $V^{+4}$, the composition for forming a sealing material 27 may not include the $V^{+4}$. In the latter case, the $V^{+4}$ can be generated by a heat treatment as described later.

Figure 3D:
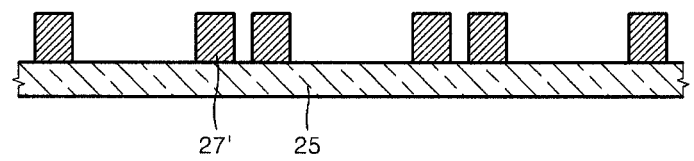

Subsequently, the second substrate 25 to which the composition for forming a sealing material 27 is provided is heat treated thereby forming heat-treated composition for a sealing material 27' as illustrated in FIG. 3D.

Figure 3E:
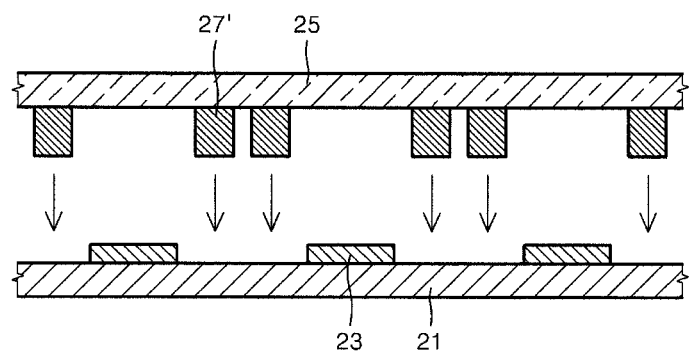
Figure 3F:
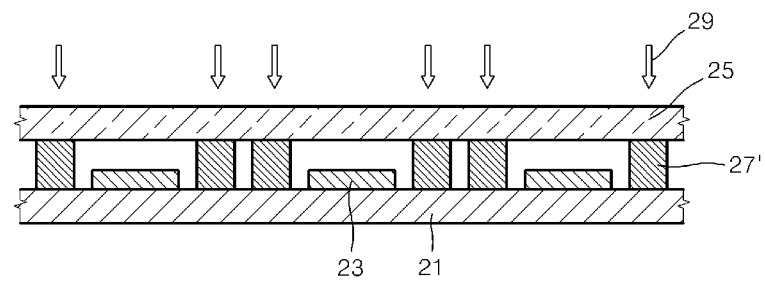

Due to the heat treatment of the composition for forming a sealing material 27, the composition for forming a sealing material 27 can be formed in a film having a predetermined shape, and some of the $V^{+5}$ in the composition for forming a seal sealing material 27 can be reduced to the $V^{+4}$. In the specification, the term "heat-treated composition for forming a sealing material" is used to represent above changes after the heat treatment of the composition for forming a sealing material 27. Accordingly, as illustrated in FIG. 3E, the coupling of the first substrate 21 to the second substrate 25 can be effectively performed. Further, as illustrated in FIG. 3F, when electro-magnetic waves is irradiated as illustrate in FIG. 3F, the electro-magnetic waves can be effectively absorbed by $V^{+4}$. As a result of the heat treatment, a vehicle in the composition for forming a sealing material 27 can decompose.

The heat treatment can be performed in a reducing atmosphere or an air atmosphere. The reducing atmosphere can be an $N_2$ atmosphere or a hydrogen atmosphere. Due the heat treatment, $V^{+5}$ in the composition for forming sealing material 27 can be reduced into $V^{+4}$. In particular, when the glass frit does not include $V^{+4}$ and the composition for forming a sealing material 27 does not include a reductant that reduces $V^{+5}$ into $V^{+4}$, it is desired to perform the heat treatment in the reducing atmosphere.

When the composition for forming a sealing material 27 includes the reductant, the heat treatment atmosphere is not always the reducing atmosphere. When the composition for forming the sealing materials 27 includes a reductant, such as Al, Sn, Mg, Cu, Zn, or C, the reductant is oxidized and reduces $V^{+5}$ into $V^{+4}$ when the heat treatment is performed.

The heat treatment temperature and heat treatment time may be determined in consideration of a temperature and time at which $V^{+5}$ can be reduced into $V^{+4}$ and a temperature and time at which the vehicle in the composition for forming a sealing material can decompose. For example, the heat treatment temperature and heat treatment time may be in the range of 250° C.-750° C., more specifically, 350° C.-550° C., and 5-240 minutes, more specifically, 10-120 minutes, respectively.

Each of the heat-treated composition for forming a sealing material 27' as illustrated in FIG. 3D necessarily includes $V^{+4}$. The $V^{+4}$ can be $V^{+4}$ included in the glass frit itself, $V^{+4}$ generated by reducing $V^{+5}$ in the glass frit with a reductant in the composition for forming sealing materials during the heat treatment, or $V^{+4}$ generated as a result of the heat treatment in a reducing atmosphere of $V^{+5}$ of the glass frit.

Then, as illustrated in FIG. 3E, the first substrate 21 is coupled with the second substrate 25 so that the heat-treated composition for forming a sealing material 27' and the light emitting units 23 are interposed between the first substrate 21 and the second substrate 25. At this point, for example, each of the heat-treated composition for forming a sealing material 27' may surround each of the light emitting units 23.

Figure 3G:
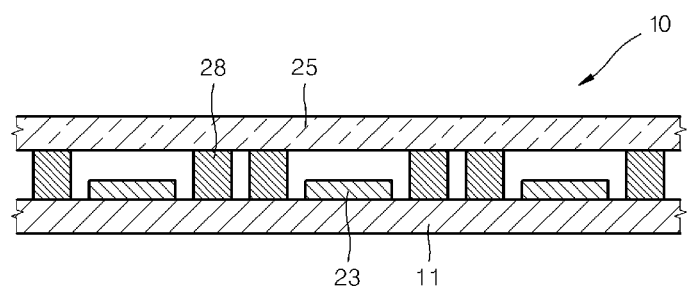

Then, as illustrated in FIG. 3F, electro-magnetic waves 29 are irradiated on the heat-treated composition for forming a sealing material 27' to form a plurality of sealing materials 28 as illustrated in FIG. 3G, which bond the first substrate 21 to the second substrate 25 and respectively seal the light emitting units 23.

The electro-magnetic waves 29 can be irradiated on the heat-treated composition for forming a sealing material 27' through the first substrate 21 or the second substrate 25. At this point, the $V^{+4}$ in the heat-treated composition for forming a sealing material 27' absorbs the electro-magnetic waves 29, so that the composition is softened and/or melted by the resulting energy and thus the sealing materials 28 are formed.

The electro-magnetic waves 29 may have a wavelength of 200 nm-10,000 nm so that the $V^{+4}$ can absorb the electro-magnetic waves 29. Accordingly, the electro-magnetic waves 29 can be ultraviolet rays, visible rays, or infrared rays. The electro-magnetic waves 29 can be provided using a laser or light-emitting lamp emitting electro-magnetic waves in such a wavelength range. However, electro-magnetic waves 29 can be provided using other devices. For example, the electro-magnetic waves 29 can be a laser ray with a wavelength of 810 nm. The glass fit may have a light transmittance of about 40% or less for light with a wavelength from about 650 nm to about 1000 nm As illustrated in FIG. 3F, according to the current embodiment, the electro-magnetic waves 29 can be selectively irradiated only on the areas where the sealing materials 28 are to be formed. As a result, deterioration of the light emitting units 23 occurring when the sealing materials 28 are formed can be prevented.

The method of manufacturing a light emitting device according to an embodiment of the present invention has been described with reference to FIGS. 3A through 3G. However, the method is not limited thereto.

A plurality of sealing materials of a light emitting device according to an embodiment of the present invention can be formed by irradiation of electro-magnetic waves. As such, the heat-treated composition for forming a sealing material 27' necessarily includes $V^{+4}$. The $V^{+4}$ included in the heat-treated composition for forming a sealing material 27' can be obtained using various methods as described below:

a) a composition for forming a sealing material including a glass frit having $V^{+4}$ can be used;

b) A heat treatment where $V^{+5}$ can be reduced into $V^{+4}$ by a reductant that reduces $V^{+5}$ into $V^{+4}$ in a composition for forming a sealing material; and c) $V^{+5}$ in a composition for forming a sealing material can be reduced into $V^{+4}$ by performing a heat treatment in a reducing atmosphere.

At least one of a), b), and c) can be used. For example, the composition for forming a sealing material including a glass frit having $V^{+4}$ is further subjected to a heat treatment in a reducing atmosphere, so that $V^{+5}$ in the glass frit can be additionally reduced into $V^{+4}$.

The present invention will be described in further detail with reference to the following examples. These examples are for illustrative purposes only and are not intended to limit the scope of the present invention.

Example 1

A. Preparing of Glass Frit/Composition 29.2 g of $V_2O_5$, 5.2 g of ZnO, 14.7 g of BaO, and 50.8 g of $TeO_2$ are mixed in a Pt melting pot, and then heat treated at 800° C. for approximately one hour in an electric oven. The melted product that is obtained as a result of the heat treatment is cooled and ball milled, thereby obtaining a glass fit having an average particle diameter of 2 μm and a largest particle diameter of 10 μm. The glass frit includes $V^{+5}$, $Zn^{+2}$, $Ba^{+2}$, and $Te^{+4}$.

50 g of the glass fit is mixed with 50 g of $Zr_2(WO_4)(PO_4)_2$ having an average particle diameter of 3 μm and a largest particle diameter of 15 μm (product name: ZWP, manufacturer: KCM Co.), and then a thermal expansion coefficient of the mixture of the glass fit and the $Zr_2(WO_4)(PO_4)_2$ is measured using a thermal mechanical analysis (TMA) apparatus. As a result, the thermal expansion coefficient of the mixture of the glass frit and the $Zr_2(WO_4)(PO_4)_2$ is approximately $50 \times 10^{-7}/°C$.

50 g of a vehicle including an ethylcellulose-based resin is added to the mixture of the glass frit and the $Zr_2(WO_4)(PO_4)_2$ and stirred, thereby obtaining a composition for forming a sealing material.

B. Heat Treatment of a Composition

The composition for forming a sealing material obtained from the manufacturing process described above in step A of Example 1 is coated on a glass substrate by a screen printing method to a width of 600 μm and thickness of 30 μm, and then the coated result is heat treated at 420° C. for 4 hours in an $N_2$ atmosphere.

Comparative Example 1

A composition for forming sealing materials is manufactured using the same method described in step A of Example 1. Then, the composition for forming a sealing material is heat treated in the same manner as in step B of Example 1, except that an air atmosphere is used instead of the $N_2$ atmosphere.

Measurement Example 1

Light Transmission

Figure 4:
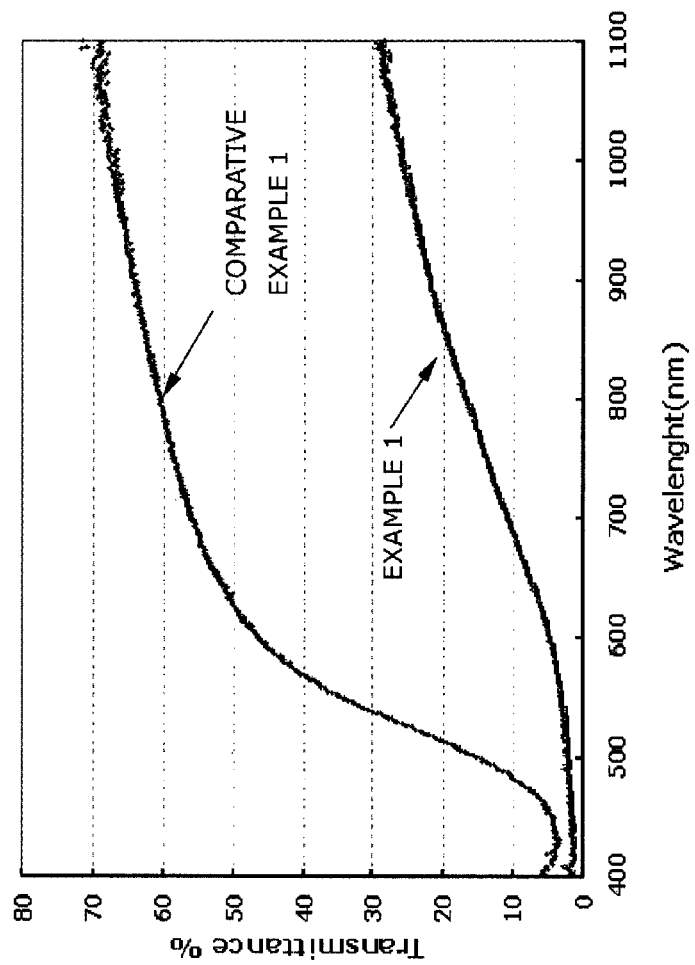
FIG. 4 is a graph illustrating light transmission of a heat-treated composition for forming a sealing material (heat treatment under $N_2$ atmosphere) obtained according to Example 1 according to an embodiment of the present invention and a heat-treated composition for forming a sealing material (heat treatment under an air atmosphere) obtained according to Comparative Example 1.

A light transmission of the heat-treated composition for forming a sealing material (heat treatment in an $N_2$ atmosphere) obtained according to Example 1 and the heat-treated composition for forming a sealing material (heat treatment in an air atmosphere) obtained according to Comparative Example 1 is measured by irradiating light with a wavelength of 400 nm to 1100 nm through each of the glass substrates, and then a respective light transmission is measured using an UV-VIS Spectrometer. The results are shown in FIG. 4. Referring to FIG. 4, at a wavelength of 810 nm, the light transmission of the heat-treated composition for a forming sealing material (heat treatment in an $N_2$ atmosphere) obtained according to Example 1 is 17.5%, and the light transmission of the heat-treated composition for forming a sealing material (heat treatment in an air atmosphere) obtained according to Comparative Example 1 is 60.5%. That is, it is found that the heat-treated composition for forming a sealing material (heat treatment in an $N_2$ atmosphere) obtained according to Example 1 effectively can absorb visible-infrared light resulting from a reduction of a $V^{+5}$ into $V^{+4}$ as a result of the heat treatment in an $N_2$ atmosphere.

Example 2

A first glass substrate including an organic light emitting unit that is manufactured by SDI Co., Ltd. is prepared. A composition forming a sealing material is prepared in the same manner as in step A of Example 1, and then provided on a second glass substrate that functions as an encapsulation substrate in the same manner as in step B of Example 1. The second glass substrate on which the composition for forming a sealing material is provided is heat treated at 420° C. for 4 hours in an $N_2$ atmosphere to form a heat-treated composition for forming a sealing material.

Then, the first glass substrate is coupled to the second glass substrate such that the heat-treated composition for forming a sealing material respectively surround the organic light emitting units, and then a laser with a wavelength of 810 nm is irradiated on the heat-treated composition for forming a sealing material to form sealing materials.

Figure 5:
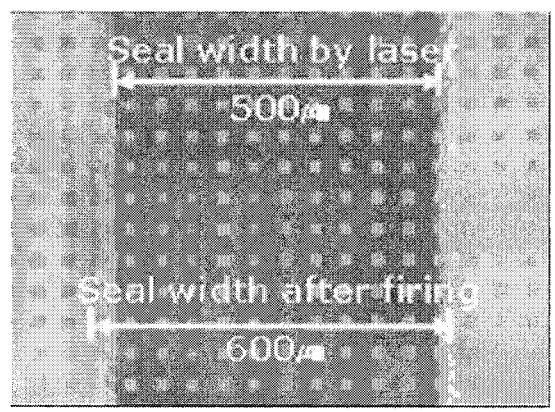
FIG. 5 is an image illustrating a seal with of a sealing material obtained according to Example 2, according to an embodiment of the present invention.

FIG. 5 is an image of a seal width of one of the sealing material obtained from Example 2. Referring to FIG. 5, the seal width of the sealing material is approximately 500 μm. As a result, it is found that the heat-treated composition for forming a sealing material absorbed the laser and thus melted, so that the sealing materials are formed.

Comparative Example 2

This experiment is performed in the same manner as in Example 2, except that the composition for forming a sealing material is heat treated in an air atmosphere instead of the $N_2$ atmosphere. As a result, it is impossible to achieve a formation of the sealing material by irradiation of a laser with a wavelength of 810 nm on the sealing materials, so that the first glass substrate and the second glass substrate are not sealed. Such a result may result from the assumption that $V^{+4}$ is not sufficiently formed by heat treatment in an air atmosphere and thus the laser is not effectively absorbed.

Comparative Example 3

An organic light emitting device is manufactured in the same manner as in Example 2, except that an epoxy resin, which is an organic sealing material, is coated on the second substrate instead of the composition for forming a sealing material, and then hardened to form a sealing materials.

Measurement Example 2

Lifetime Characteristics

Figure 6A:
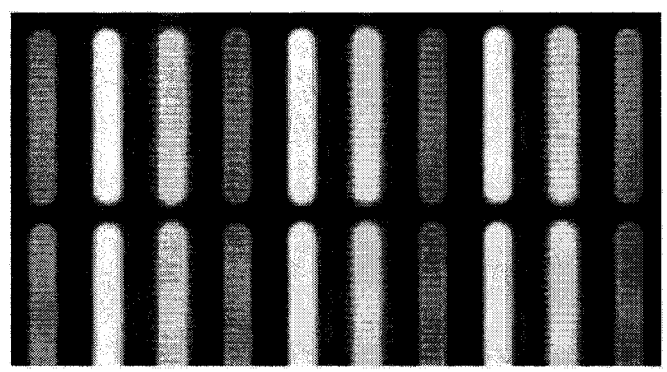
FIG. 6A is an image illustrating a lifetime property of an organic light emitting device obtained according to Example 2, according to an embodiment of the present invention.
Figure 6B:
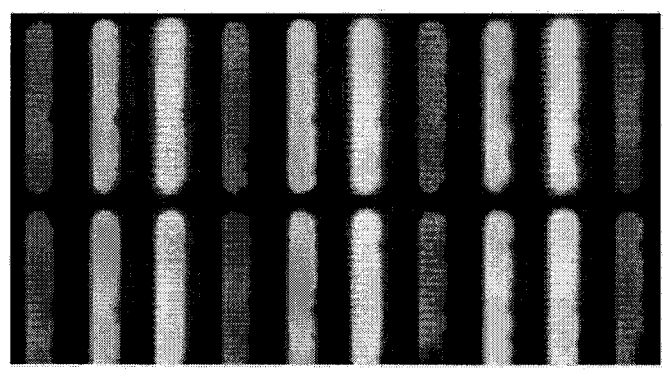
FIG. 6B is an image illustrating a lifetime property of an organic light emitting device obtained according to Comparative Example 2, according to an embodiment of the present invention.

The lifetimes of the organic light emitting devices obtained according to Example 2 and Comparative Example 3 are measured and shown in FIG. 6A and FIG. 6B, respectively.

More specifically, the organic light emitting devices were left to sit in a relative humidity of 85% at 85° C. for 300 hours, and the operation test of the organic light emitting devices is performed to measure the lifetimes of the organic light emitting devices. FIG. 6A is an image of the organic light emitting device obtained according to Example 2, and FIG. 6B is an image of the organic light emitting device obtained according to Comparative Example 3. By comparing FIGS. 6A and 6B, dark spots were not substantially formed in the image of FIG. 6A. Such a result may result from an assumption that deterioration due to water did not occur due to the sealing materials of the organic light emitting device obtained according to Example 2. Accordingly, it is found that a light emitting device according to an embodiment of the present invention has a long lifetime.

According to embodiments of the present invention, sealing materials can be formed absorbing electro-magnetic waves which can be selectively provided, such as a laser or light-emitting lamp. Therefore, a deterioration of a light emitting unit occurring when the sealing materials are formed can be prevented. Further, the sealing material according to embodiments of the present invention has good sealing properties. Thus, a light emitting device having a long lifetime can be obtained.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A glass frit device comprising:
a glass plate comprising a surface; and
a glass frit comprising vanadium in the form of $V^{+4}$,
wherein the glass frit forms a closed loop on the surface of the glass plate,
wherein the glass frit has a light transmittance of about 50% or less for light with a wavelength of 810 nm;
wherein the glass fit is in the form of a sintered body, and
wherein the $V^{+4}$ is present more on the surface of the sintered body than the interior of the sintered body.

2. The glass fit device of claim 1, wherein the sintered body has light transmittance of 40% or less for light with the wavelength of 810 nm.

3. The glass fit device of claim 1, wherein the sintered body has light transmittance of 40% or less for light with a wavelength from about 650 nm to about 1000 nm.

4. The glass frit device of claim 1, wherein the $V^{+4}$ is present in the glass frit in an amount from about 0.0001 wt % to about 10 wt %.

5. The glass frit device of claim 1, wherein the glass frit further comprises at least one ion selected from the group consisting of $V^{+5}$, $Ba^{+2}$, $Zn^{+2}$, $Te^{+4}$, $Fe^{+3}$, $Cu^{+2}$, $Nd^{+2}$, $K^{+1}$, $Sb^{+3}$, $P^{+5}$, $Ti^{+2}$, $Al^{+3}$, $B^{+3}$, $W^{+6}$, $Sn^{+2}$, $Bi^{+3}$, $Ca^{+2}$, $Si^{+4}$, $Zr^{+4}$, and $Mg^{+2}$.

6. The glass frit device of claim 1, wherein the glass frit further comprises at least one ion selected from the group consisting of $V^{+5}$, $Ba^{+2}$, $Zn^{+2}$ and $Te^{+4}$.

7. The glass frit device of claim 1, wherein the glass frit further comprises at least one reductant selected from the group consisting of Sn, Al, Mg, Cu, and Zn.

8. The glass frit device of claim 1, wherein the presence of the $V^{+4}$ in the glass frit is detectable by X-ray Photoelectron Spectroscopy (XPS).

9. A method of manufacturing the glass fit device of claim 1, comprising:
providing the glass plate comprising the surface;
forming a closed loop structure of a paste composition;
heating the closed loop structure so as to form the glass frit forming a closed loop on the surface; and
wherein the glass frit comprises $V^{+4}$ and has a light transmittance of about 50% or less for light with a wavelength of 810 nm.

10. The method of claim 9, wherein heating of the closed loop structure is performed under an $N_2$ atmosphere.

11. The method of claim 9, wherein the heat treatment temperature of the heating of the closed loop structure is from about 250° C. to 750° C.

12. The method of claim 9, wherein the heat treatment temperature of the heating of the closed loop structure is from about 350° C. to 550° C.

13. The method of claim 9, wherein the heat treatment temperature of the heating of the closed loop structure is 420° C.

14. The method of claim 9, wherein the heat treatment time of the heating the closed loop structure is from about 5 minutes to about 240 minutes.

15. The method of claim 9, wherein the heat treatment time of the heating the closed loop structure is 240 minutes.

16. A method of making a display device, the method comprising:
providing the glass frit device of claim 1;
providing an intermediate device comprising a substrate and an array of light emitting devices formed on the substrate;
arranging the glass frit device and the intermediate device such that the glass frit is interposed between the glass plate and the substrate, and wherein the glass frit contacts the substrate while surrounding the array; and
applying a laser onto the glass frit so as to bond the glass frit to the substrate.

17. The method of claim 16, wherein the glass frit has a light transmittance of the laser about 40% or less.

18. A display device comprising:
a first substrate;
a second substrate;
an array of light emitting devices interposed between the first substrate and the second substrate; and
the glass frit device of claim 1,
wherein the glass frit is interposed between and bonds the first substrate to the second substrate.

19. The light emitting device of claim 18, wherein the light emitting device comprises an organic light emitting diode.

* * * * *